/

US008053853B2

(12) United States Patent
Chyan et al.

(10) Patent No.: US 8,053,853 B2
(45) Date of Patent: Nov. 8, 2011

(54) COLOR FILTER-EMBEDDED MSM IMAGE SENSOR

(75) Inventors: Jiunn-Yih Chyan, National Tsing Hua University (TW); Gwo-Yuh Shiau, Hsinchu (TW); Chia-Shiung Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1178 days.

(21) Appl. No.: 11/416,875

(22) Filed: May 3, 2006

(65) Prior Publication Data
US 2007/0257283 A1  Nov. 8, 2007

(51) Int. Cl.
*H01L 31/113* (2006.01)

(52) U.S. Cl. ........ 257/431; 257/440; 257/443; 257/454; 257/471; 257/473; 257/448; 257/465; 257/462; 257/463; 257/464

(58) Field of Classification Search ............ 257/290, 257/443, 461, 462, 463, 464, 465, E31.066, 257/54, 449, 453, 454, 471, 473, 448, 432, 257/433, 434, 232, 292, 294, E27.133, E27.134, 257/E27.131, E27.142, 431, 440; 438/70, 438/71, 72, 73; 250/208.1, 226
See application file for complete search history.

(56) References Cited

U.S. PATENT DOCUMENTS

| | | | |
|---|---|---|---|
| 5,336,879 A | | 8/1994 | Sauer |
| 5,525,828 A | * | 6/1996 | Bassous et al. ............... 257/457 |
| 5,631,490 A | * | 5/1997 | Dutta et al. .................. 257/457 |
| 5,703,357 A | | 12/1997 | Shih et al. |
| 6,107,652 A | * | 8/2000 | Scavennec et al. ........... 257/184 |
| 6,150,683 A | * | 11/2000 | Merrill et al. ................. 257/292 |
| 6,362,513 B2 | | 3/2002 | Wester |
| 6,628,392 B2 | | 9/2003 | Kuroda et al. |
| 6,737,719 B1 | | 5/2004 | Yamamoto |
| 6,765,276 B2 | | 7/2004 | Fasen et al. |
| 6,815,787 B1 | | 11/2004 | Yaung et al. |
| 6,870,149 B2 | * | 3/2005 | Berezin ...................... 250/208.1 |
| 7,248,297 B2 | | 7/2007 | Catrysse et al. |

(Continued)

FOREIGN PATENT DOCUMENTS

| | | |
|---|---|---|
| EP | 1 008 870 A1 | 6/2000 |
| JP | 10-1042169 | 2/1989 |
| TW | 92104424 | 3/2003 |
| TW | I255440 | 5/2006 |
| WO | WO 2005 / 092037 A2 | 6/2005 |

OTHER PUBLICATIONS

L. Yang et al, "High Performance of Fe:InP/InGaAs Metal/Semiconductor/Metal Photodetectors Grown by Metalorganic Vapor Phase Epitaxy", IEEE Photonics Technology, vol. 2, No. 1, Jan. 1990, pp. 56-58.*

(Continued)

*Primary Examiner* — Ha Tran T Nguyen
*Assistant Examiner* — Suberr Chi
(74) *Attorney, Agent, or Firm* — Haynes and Boone, LLP

(57) ABSTRACT

An image sensor device includes a semiconductor substrate having a light-sensing region, and a first and second electrode embedded within the substrate. The first and second electrode forms an array of slits, the array of slits is configured to allow a wavelength of light to pass through to the light-sensing region. A method for making an image sensor device includes providing a semiconductor substrate, forming a plurality of pixels on the semiconductor substrate, and forming a plurality of slits embedded within each of the plurality of pixels. The plurality of slits is configured to allow a wavelength of light to pass through to each of the plurality of pixels.

17 Claims, 4 Drawing Sheets

U.S. PATENT DOCUMENTS

| | | | |
|---|---|---|---|
| 7,630,133 | B2 | 12/2009 | Perkins |
| 2003/0103150 | A1 | 6/2003 | Catrysse et al. |
| 2004/0042083 | A1 | 3/2004 | Turner, III |
| 2004/0080036 | A1 | 4/2004 | Chang et al. |
| 2004/0085796 | A1 | 5/2004 | Tatsumi |
| 2005/0121599 | A1 | 6/2005 | Mouli |
| 2005/0167709 | A1 | 8/2005 | Augusto |
| 2006/0044429 | A1 | 3/2006 | Toda et al. |
| 2006/0097134 | A1 | 5/2006 | Rhodes |
| 2006/0192083 | A1 | 8/2006 | Fu et al. |
| 2007/0034777 | A1 | 2/2007 | Tuckerman et al. |
| 2007/0257283 | A1 | 11/2007 | Chyan et al. |

OTHER PUBLICATIONS

Peter B. Catrysse et al., "Integrated color pixels in 0.18-um complementary metal oxide semiconductor technology", 2003 Optical Society of America, vol. 20, No. 12/Dec. 2003, pp. 2293-2306.

Taiwanese Office Action, Office Action of Nov. 25, 2009, Application No. 095143350, 4 pages.

Singapore Written Opinion and Search Report issued Jul. 8, 2010 by the Intellectual Property Office if Singapore for Singapore Application No. 200605020-7, 17 pages.

Schmidt et al., "Color filtering metallization for optoelectronic 100nm CMOS circuits", Electron Devices Meeting, 2003 IEDM 2003 Technical Digest, IEEE International, Dec. 8-10, 2003, pp. 16.2.1-16.2.4.

Chen et al., "Wavelength detector using a pair of metal-semiconductor-metal photodetectors with subwavelength finger spacings", Electronics Letters, Aug. 1, 1996, vol. 32, No. 16, 2 pages.

Taiwanese Patent Office, Office Action issued Sep. 29, 2010, Application No. 095143350, 8 pages.

* cited by examiner

COLOR FILTER-EMBEDDED MSM IMAGE SENSOR

BACKGROUND

An image sensor provides a grid of pixels, such as photosensitive diodes or photodiodes, reset transistors, source follower transistors, pinned layer photodiodes, and/or transfer transistors for recording an intensity or brightness of light. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD), complimentary metal oxide semiconductor (CMOS) image sensor (CIS), an active-pixel sensor, and a passive-pixel sensor.

Another type of pixel is a metal-semiconductor-metal (MSM) photodetector. This type is constructed with two Schottky contacts (e.g., metallic electrodes) on a semiconductor material, instead of a p-n junction as in a photodiode. A voltage potential is applied between the electrodes which creates an electric field in the semiconductor material. The light that is absorbed in the semiconductor material generates electric carriers that are collected by the electric field. These electric carriers contribute to a photocurrent that can be measured and recorded. MSM photodetectors have generally been used in optical telecommunication systems due to their high speed and low parasitic capacitance. However, MSM photodetectors have low responsivity caused by reflection from the surface metal contacts and semiconductor surface.

In order to capture color, image sensors employ a color filter layer that can support several different color filters (e.g., red, green, and blue), and are positioned such that the incident light is directed through the filter. This can be done by using a color filter array mosaic on a single sensor or splitting the incident light with a prism to multiple sensors. Either way, the cost of the color filters used in image sensors accounts for a large part of the total cost of the image sensor. Additionally, the color filter layer adds to the physical size of the device. Improvements in color filter design and fabrication are desired to reduce the cost and size of image sensors.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
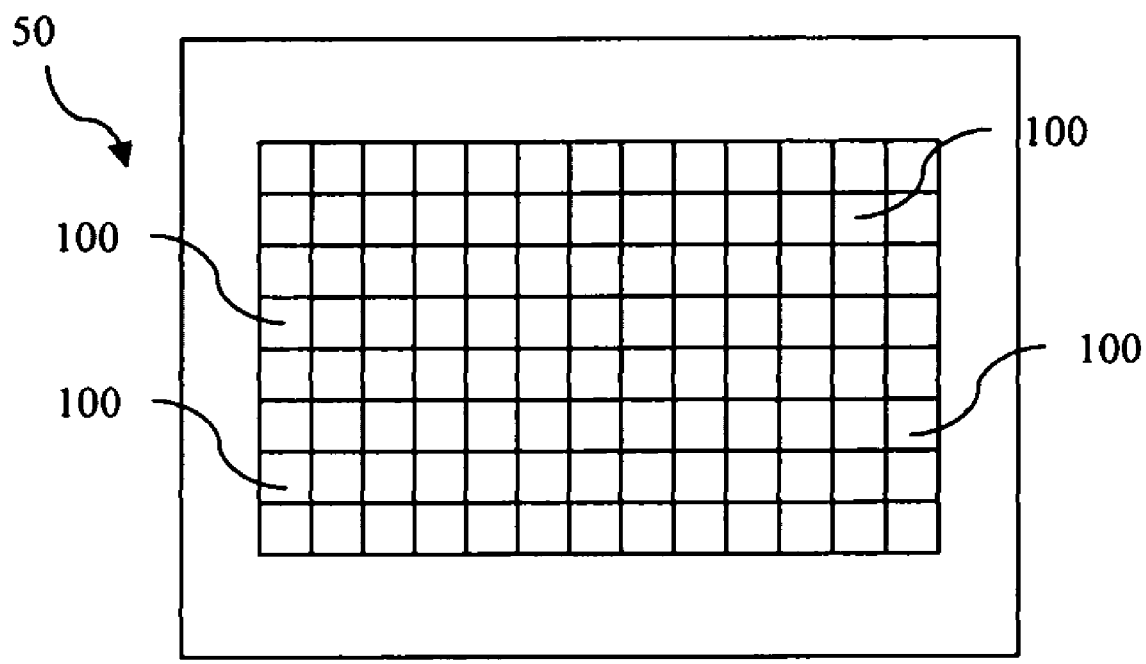
FIG. 1 is a top view of a sensor including a plurality of pixels, according to one or more embodiments of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 provides a grid of pixels 100. Additional circuitry and input/outputs are typically provided adjacent to the grid of pixels 100 for providing an operation environment for the pixels and for supporting external communications with the pixels.

Figure 2:
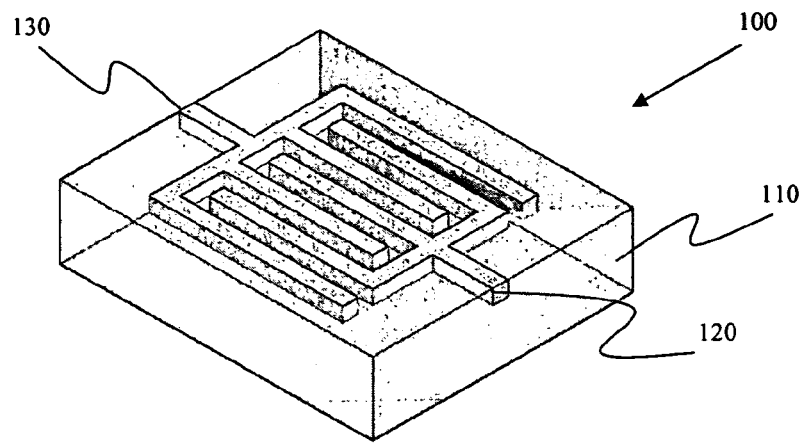
FIG. 2 is a top view of a pixel having an embedded metal-semiconductor-metal (MSM) photodetector, constructed according to aspects of the present disclosure.

Referring now to FIG. 2, in the present embodiment, the pixels 100 are a type of metal-semiconductor-metal (MSM) photodetectors. The pixel 100 includes a silicon substrate 110. Alternatively, the substrate 110 may comprise an elementary semiconductor such as silicon, germanium, and diamond. The substrate 110 may also comprise a compound semiconductor such as silicon carbide, gallium arsenic, indium arsenide, and indium phosphide. Also, semiconductor arrangements such as silicon-on-insulator (SOI) and/or an epitaxial layer can be provided.

A highly anisotropic (or vertical sidewalls) etch is performed on the substrate 110 in order to form embedded electrodes 120, 130 as discussed below. This can be done by a variety of different techniques. One technique is to apply a photosensitive layer to the surface of the substrate 110, pattern the photosensitive layer with the specified geometry, and dry plasma etch the substrate according to the pattern. This process can be repeated to create different patterns for the electrode formation.

The two electrodes 120, 130 are made from a conductive metal such as Cu, Ag, or Au. The electrodes 120, 130 are embedded within the silicon substrate 110 and arranged to form a rectangular shaped array of slits as shown. After patterning and etching, a metal deposition process is done to form the electrodes 120, 130 and may be finished off with a metal polishing process. Because these embedded MSM photodectors are inherently planar, it allows for easy fabrication and integration with the various types of image sensors.

Figure 3:
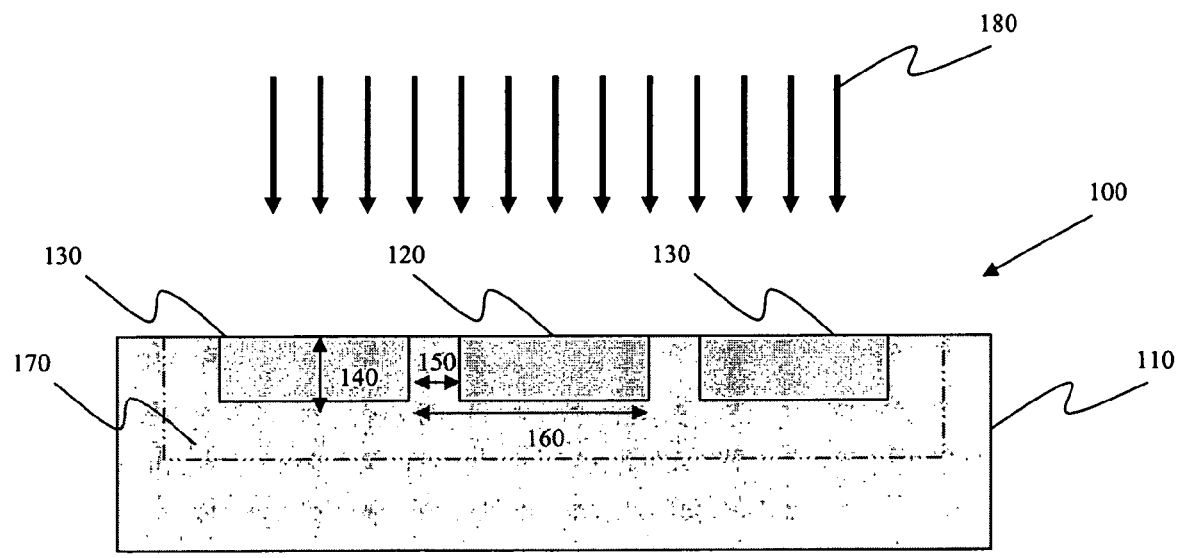
FIG. 3 is a sectional view of the pixel shown in FIG. 2.

Referring now to FIG. 3, a voltage potential is applied between the electrodes 120, 130 which results in an electric field generated within a light-sensing region 170 (or light absorption area) of the substrate 110. The pixel 100 is designed to receive light 180 directed at the surface of the semiconductor substrate 110 during applications. However, not all of the light 180 signal passes through to the light-sensing region 170. The array of slits formed by the electrodes 120, 130 functions as a filter passing only a specific wavelength of light through to the light-sensing region 170. The specific wavelength of light is determined by a thickness 140, width 150, and spacing 160 of the slits formed by the electrodes 120, 130. For the sake of example, the wavelength for red, green, and blue light may be filtered through to the light-sensing region 170 by setting the parameters of the slits to the following: thickness 140 between 100 nm to 600 nm; width 150 between 20 nm to 100 nm; and spacing 160 between 180 nm to 50 nm.

The light 180 that is absorbed by the semiconductor substrate 110 generates electric carriers which are collected by the electric field generated by the electrodes 120, 130. Because of this electric field, the light-sensing region 170 of the present embodiment does not require doping and/or forming depletion regions around p-n junctions to store photogenerated electron-hole pairs. As a result, a parasitic capacitance effect between the active region and adjacent transistor does not exist. The electric carriers contribute to a photocurrent that can be measured and recorded. The amount of photocurrent relates to the intensity or brightness of the light signal that was absorbed by the pixel 100—the more light, the higher the photocurrent. The photocurrent may be communicated and processed by other circuitry depending on the application for which the sensor is used for. It is understood that the light 180 is not limited to visible light beam, but can be infrared (IR), ultraviolet (UV), and other radiation.

Figure 4:
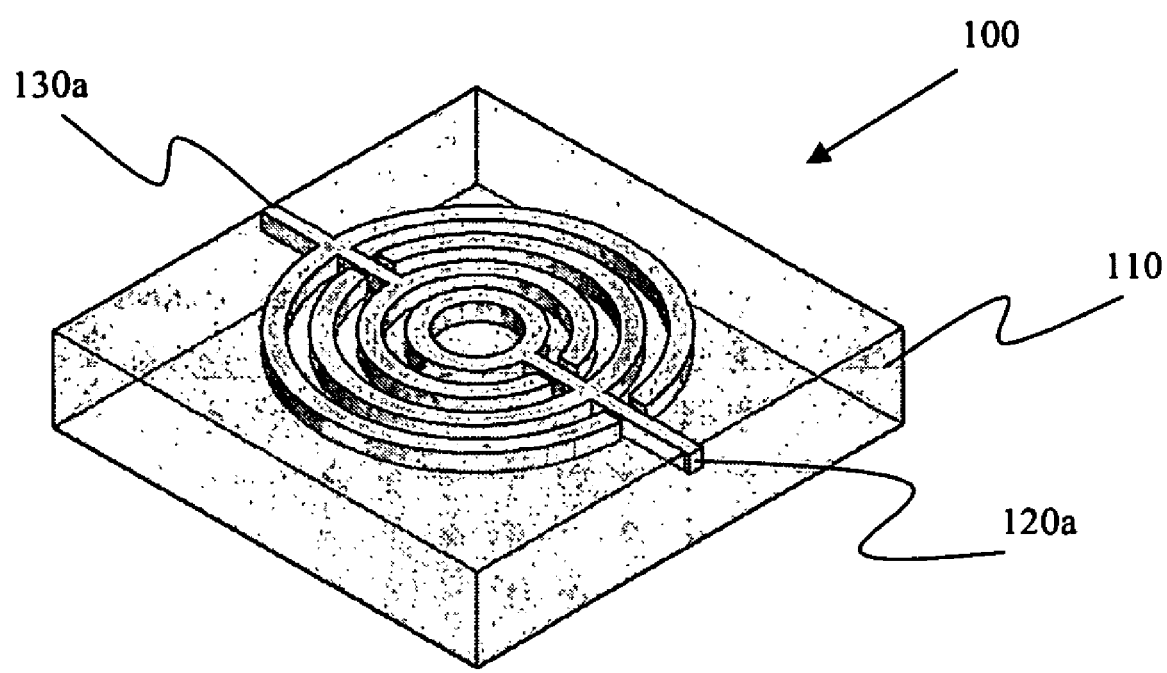
FIG. 4 is a top view of another pixel having an embedded MSM photodetector, constructed according to aspects of the present disclosure.

Referring now to FIG. 4, in another embodiment, the pixel 100 is the same as the one shown in FIG. 2 except for the pixel includes a circular shaped array of slits instead of rectangular. The electrodes 120a, 130a embedded within the silicon substrate 110 form an array of slits made up of concentric circles. The cross sectional view of this embodiment is the same as the one shown in FIG. 3. The parameters of the slits have the same range of values, as discussed above, for filtering red, green, and blue light. Even though the array of slits is formed by four concentric circles, it is understood that the number of circles may vary depending on the size of the pixel 100 and/or other design requirements.

Figure 5:
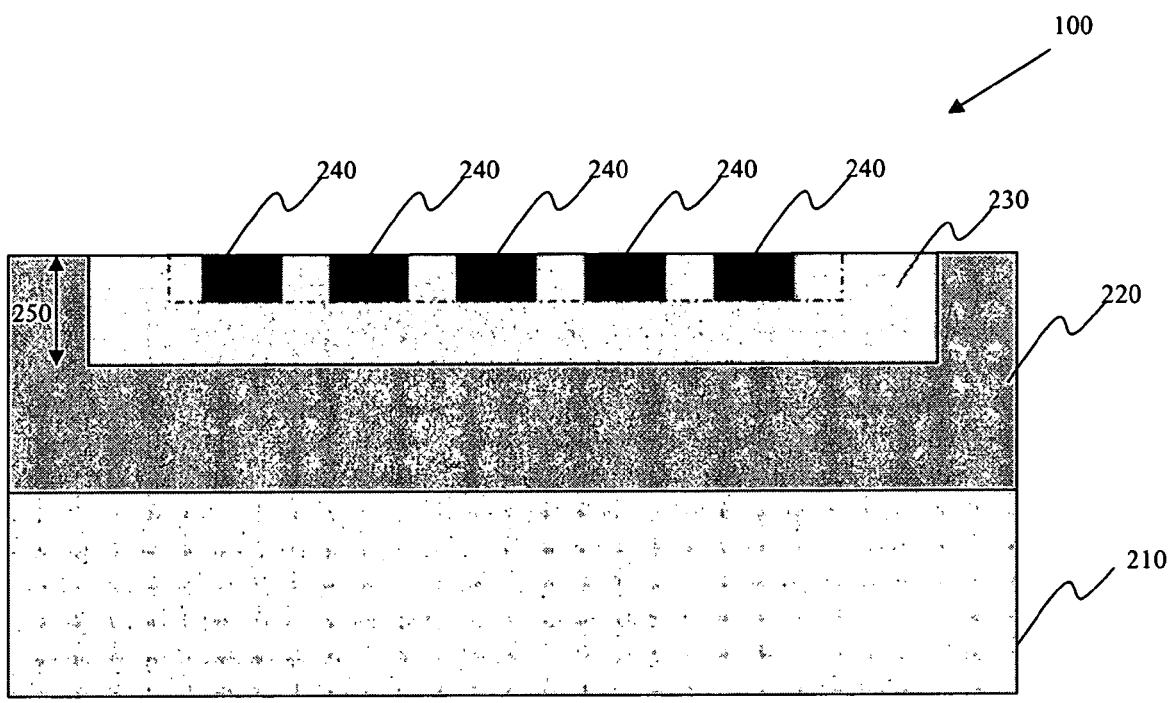
FIG. 5 is a sectional view of another pixel having an embedded MSM color filter, constructed according to aspects of the present disclosure.

Referring now to FIG. 5, in still another embodiment, the pixels 100 are photosensitive diodes or photodiodes, for recording an intensity or brightness of light. The pixels 100 are formed on a silicon substrate 210. The substrate 210 comprises a P-type silicon. A silicon epitaxial layer (epilayer) 220 is grown on the substrate 210 by a method such as chemical vapor deposition (CVD). The epilayer 220 has a lower concentration of dopant than that of the heavily doped P-type silicon substrate 210. The pixel 100 also includes a light-sensing region 230 which in the present embodiment is an N-type doped region having dopants formed in the silicon epilayer 220. All doping may be implemented using a process such as ion implantation or diffusion in various steps. The substrate 210 may comprise lateral isolation features to separate different devices on the substrate.

The pixel 100 further includes an array of slits 240. The array 240 is an embedded MSM type arrangement within the light-sensing region 230. The array 240 may have a rectangular shape as shown in FIG. 2 or a circular shape as shown in FIG. 4. The array of slits 240 functions as a color filter allowing only a specific wavelength of light to pass through to the light-sensing region 230. The array 240 can support several different color filters (e.g., red, green, and blue) and the specific wavelength is determined by the thickness, width, and spacing of the slits. The array 240 is formed the same way and with the same range of values for the slits as discussed in FIGS. 2 and 3. However, the array 240 is not required to be formed by two electrodes since it functions only as a filter in this embodiment. Instead of an electric field, the photogenerated electric carriers are stored in depletion regions around the p-n junction formed by the P-type silicon epilayer 220 and the N-type light-sensing region 230.

The penetration depth 250 of the light-sensing region 230 is dependent on the specific wavelength of light that is filtered through by the array of slits 240. Each wavelength (e.g., red, green, and blue light) has a different effective absorption depth when passing through to the light-sensing region 230. For example, blue light experiences a more shallow effective absorption depth, as compared to red light. Thus, the penetration depth 250 for each type of color pixel varies accordingly to maximize the sensitivity of the pixel 100 to the specific wavelength of light.

Additional circuitry also exists to provide an appropriate functionality to handle the type of pixels 100 being used and the type of light being sensed. An example of a photodiode that can be used in this embodiment is shown in U.S. patent application (TSMC 2005-0433) which is hereby incorporated by reference. It is understood that the wavelengths of red, green, and blue light are provided for the sake of example, and that the pixels 100 are generally illustrated as being photodiodes for the sake of example. Other types of pixels include reset transistors, source follower transistors, pinned layer photodiodes, and transfer transistors.

Thus, provided is an improved image sensor device and method for manufacturing same. In one embodiment, an image sensor includes a plurality of pixels. At least one of the plurality of pixels includes a semiconductor substrate having a light-sensing region and a first and second electrode embedded within the substrate. The first and second electrode form an array of slits, the array of slits is configured to allow a wavelength of light, such as red, green, and blue light, to pass through to the light-sensing region. In some embodiments, the slits have a thickness between 100 nm to 600 nm, a width between 20 nm to 100 nm, and are spaced between 180 nm to 500 nm from each other. In some embodiments, the array of slits has a rectangular shape. In other embodiments, the array of slits has a circular shape. In some embodiments, the first and second electrode are made of a conductive metal, such as Cu, Ag, or Au, and a voltage potential is applied between the first and second electrode to form an electric field within the light-sensing region for sensing radiation.

In another embodiment, an image sensor includes a semiconductor substrate, a plurality of pixels formed on the substrate, and a plurality of slits embedded with each of the plurality of pixels. The plurality of slits are metallic and configured to allow a wavelength of light, such as red, green, and blue light, to pass through to each of the plurality of pixels. In some embodiments, the plurality of pixels are photodiodes. In other embodiments, the plurality of pixels are reset transistors. In other embodiments, the plurality of pixels are source follower transistors. In other embodiments, the plurality of pixels are pinned layer photodiodes. In still other embodiments, the plurality of pixels are transfer transistors.

In another embodiment, an image sensor includes a semiconductor substrate having a light-sensing region, and a first, second, and third pixel formed on the substrate. The sensor further includes a first, second, and third array of metallic slits embedded and aligned with the first, second, and third pixel, respectively. The first array is configured to allow red light to pass through to the light-sensing region of the first pixel. The second array is configured to allow green light to pass through to the light-sensing region of the second pixel. The third array is configured to allow blue light to pass through to the light-sensing region of the third pixel.

In another embodiment, a method is provided for making an image sensor device. The method includes providing a semiconductor substrate and forming a plurality of pixels on the semiconductor substrate. The method further includes forming a plurality of slits embedded within each of the plurality of pixels. The plurality of slits is configured to allow a wavelength of light, such as, red, green, and blue light, to pass though to each of the plurality of pixels. In some embodiments, the plurality of slits are formed by a first and second electrode and further includes applying a voltage potential between the first and second electrode to form an electric field for sensing the wavelength of light.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor device, comprising a plurality of pixels, at least one of the pixels comprising:
   a semiconductor substrate;
   a light-sensing region over the substrate, the light-sensing region having an upper surface; and
   a metal structure embedded within the light-sensing region such that an upper surface of the metal structure is substantially coplanar with the upper surface of the light-sensing region, wherein the metal structure forms an array of slits, wherein the array of slits includes dimensions that allow only a selected waveband of red, green, or blue light to pass through to the light-sensing region.

2. The device of claim 1, wherein the array of slits has a rectangular shape.

3. The device of claim 1, wherein the array of slits has a circular shape.

4. The device of claim 1, wherein the slits have a thickness between 100 nm to 600 nm.

5. The device of claim 1, wherein the slits have a width between 20 nm to 100 nm.

6. The device of claim 1, wherein the slits are spaced between 180 nm to 500 nm from each other.

7. The device of claim 1,
   wherein another one of the pixels has at least one of a thickness, width, and spacing for a corresponding array of slits that is different from the array of slits corresponding to the at least one pixel; and
   wherein the at least one pixel includes a further region having the light-sensing region embedded therein, the light-sensing region being doped with a first dopant and a portion of the further region other than the light-sensing region being doped with a second dopant different from the first dopant.

8. The device of claim 1, wherein the metal structure is formed of a material selected from a group consisting of: Cu, Ag, and Au.

9. The device of claim 1,
   wherein the metal structure includes first and second electrodes that form the array of slits; and
   wherein a voltage potential is applied between the first and second electrodes to form an electric field within the light-sensing region for sensing radiation.

10. An image sensor device, comprising:
    a semiconductor substrate having a top surface;
    a plurality of pixels formed on the substrate; and
    a metal structure having a plurality of slits embedded within each of the plurality of pixels, the metal structure having a top surface that is substantially coplanar with the top surface of the substrate, wherein the plurality of slits in each pixel are configured to allow only a selected waveband of visible light to pass through to that pixel.

11. The device of claim 10, wherein the metal structure is formed of a material selected from a group consisting of: Cu, Ag, and Au.

12. The device of claim 10, wherein the plurality of slits of at least one of the pixels has a thickness between 100 nm to 600 nm, a width between 20 nm to 100 nm, and are spaced between 180 nm to 500 nm from each other.

13. The device of claim 10, wherein the plurality of pixels are selected from a group consisting of: photodiodes, reset transistors, source follower transistors, pinned layer photodiodes, and transfer transistors.

14. An image sensor device, comprising:
    a substrate having a doped region;
    an epilayer on the doped region;
    a light-sensing region within the epilayer;
    a first pixel area within the light-sensing region; and
    a metal structure completely embedded within the light-sensing region, wherein the structure forms a first array of slits having a first thickness, first width, and first spacing so as to allow only a first selected waveband of visible radiation to pass through to the first pixel area;
    wherein the light-sensing region is doped with a first dopant and a portion of the epilayer other than the light-sensing region is doped with a second dopant different from the first dopant.

15. The device of claim 14, wherein the slits have a thickness between 100 nm to 600 nm and a width between 20 nm to 100 nm adjacent to the first pixel.

16. The device of claim 15, wherein the slits are spaced between 180 nm to 500 nm from each other adjacent to the first pixel.

17. The device of claim 16, further comprising:
    a further light-sensing region within the epilayer;
    a further structure embedded within the further light-sensing region; and
    a second pixel area within the further light-sensing region,
    wherein the further structure forms a second array of slits having at least one of a second thickness, second width, or second spacing that is different from the first thickness, first width, or first spacing, respectively, so as to allow only a second selected waveband of visible radiation, different from the first selected waveband of visible radiation, to pass through to the second pixel area; and
    wherein the further light-sensing region is doped with the first dopant and is free of the second dopant.

* * * * *